(12) United States Patent
Schell et al.

(10) Patent No.: US 6,566,922 B1
(45) Date of Patent: May 20, 2003

(54) ZERO PHASE AND FREQUENCY RESTART PLL

(75) Inventors: David L. Schell, Fort Collins, CO (US); Peter J. Windler, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/052,929

(22) Filed: Oct. 29, 2001

(51) Int. Cl.$^7$ ................................. G11B 5/09
(52) U.S. Cl. ................. 327/156; 327/159; 375/376; 360/51
(58) Field of Search ................. 327/156, 157, 327/362, 146; 360/51; 331/14; 375/376

(56) References Cited

U.S. PATENT DOCUMENTS

| | | | |
|---|---|---|---|
| 5,648,994 A | * | 7/1997 | Kao ........................... 327/147 |
| 5,999,060 A | * | 12/1999 | Zuta ........................... 331/14 |
| 6,028,727 A | * | 2/2000 | Vishakhadatta et al. ...... 360/51 |
| 6,307,696 B1 | * | 10/2001 | Bishop et al. .................. 360/51 |

FOREIGN PATENT DOCUMENTS

JP          2001143405          *   5/2001

* cited by examiner

Primary Examiner—Dinh T. Le
(74) Attorney, Agent, or Firm—Christopher P. Maiorana, P.C.

(57) ABSTRACT

A circuit generally comprising a first circuit and a phase lock loop. The first circuit may be configured to (i) collect a plurality of samples per cycle during a plurality of cycles of an input signal and (ii) calculate a phase offset and a frequency offset for the input signal relative to a clock signal in response to the samples. The phase lock loop may be configured to (i) preset a phase error signal to the phase offset and a frequency error signal to the frequency offset and (ii) generate the clock signal in response to the phase error signal and the frequency error signal.

18 Claims, 12 Drawing Sheets

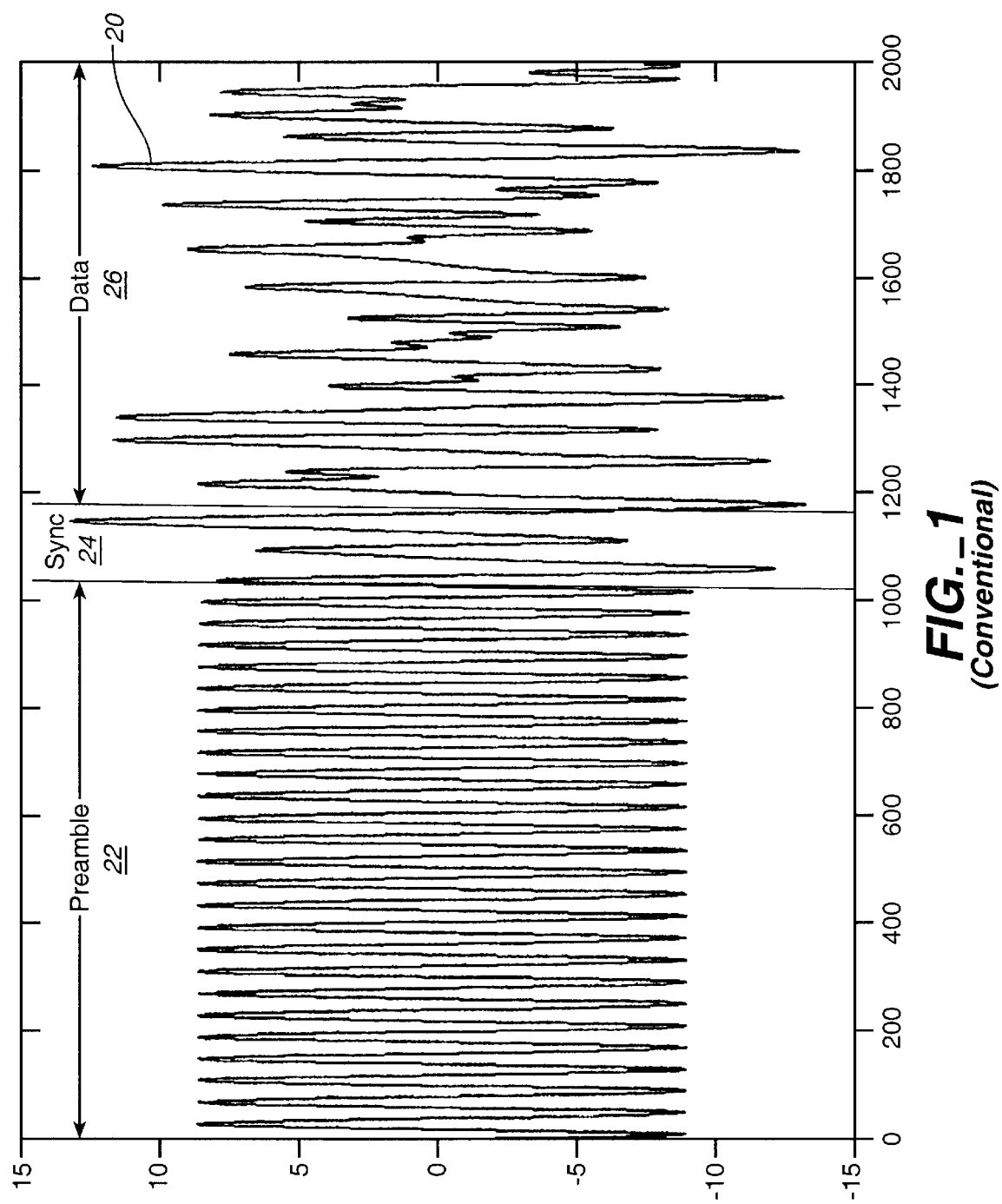
FIG._1
(Conventional)

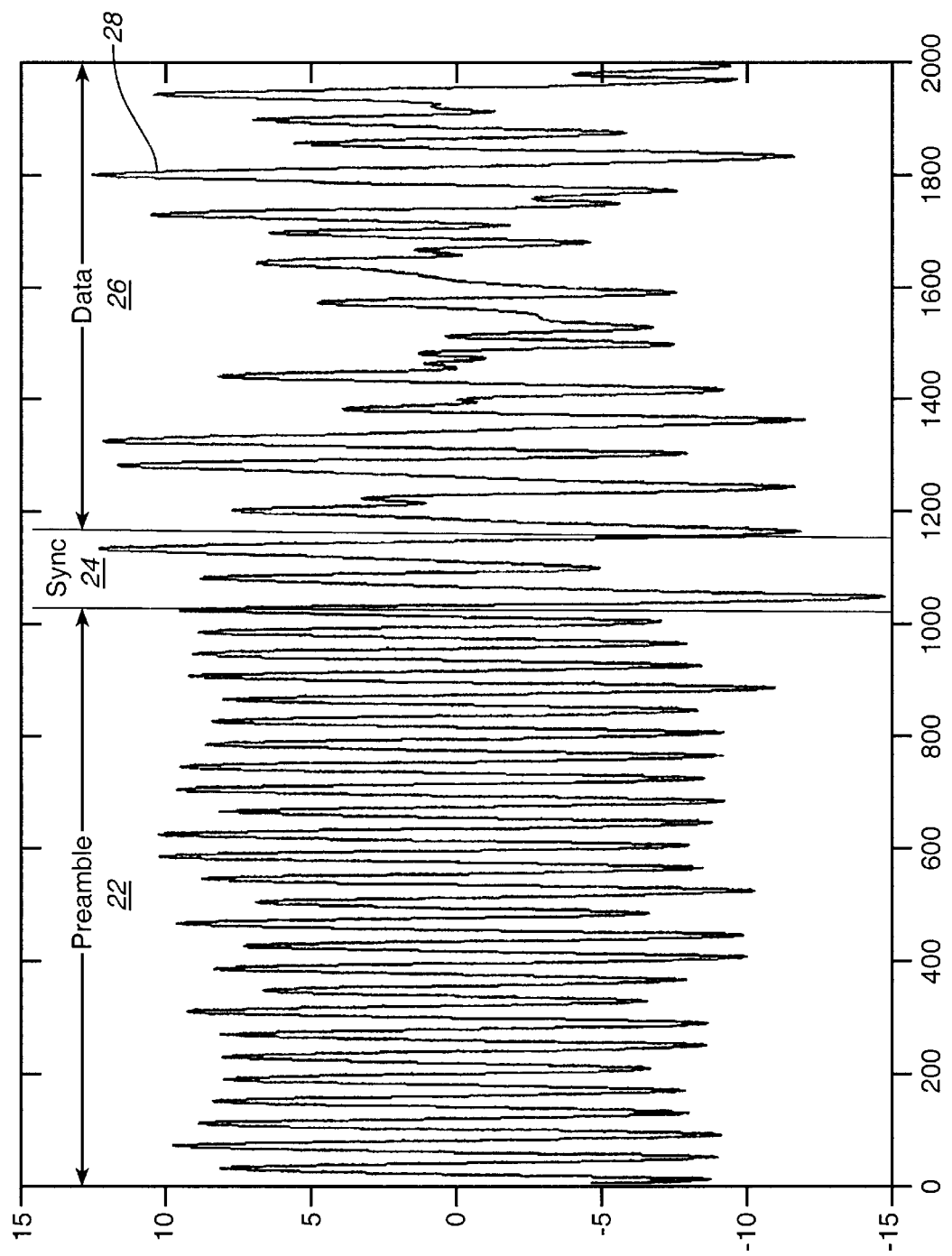
FIG._2
(Conventional)

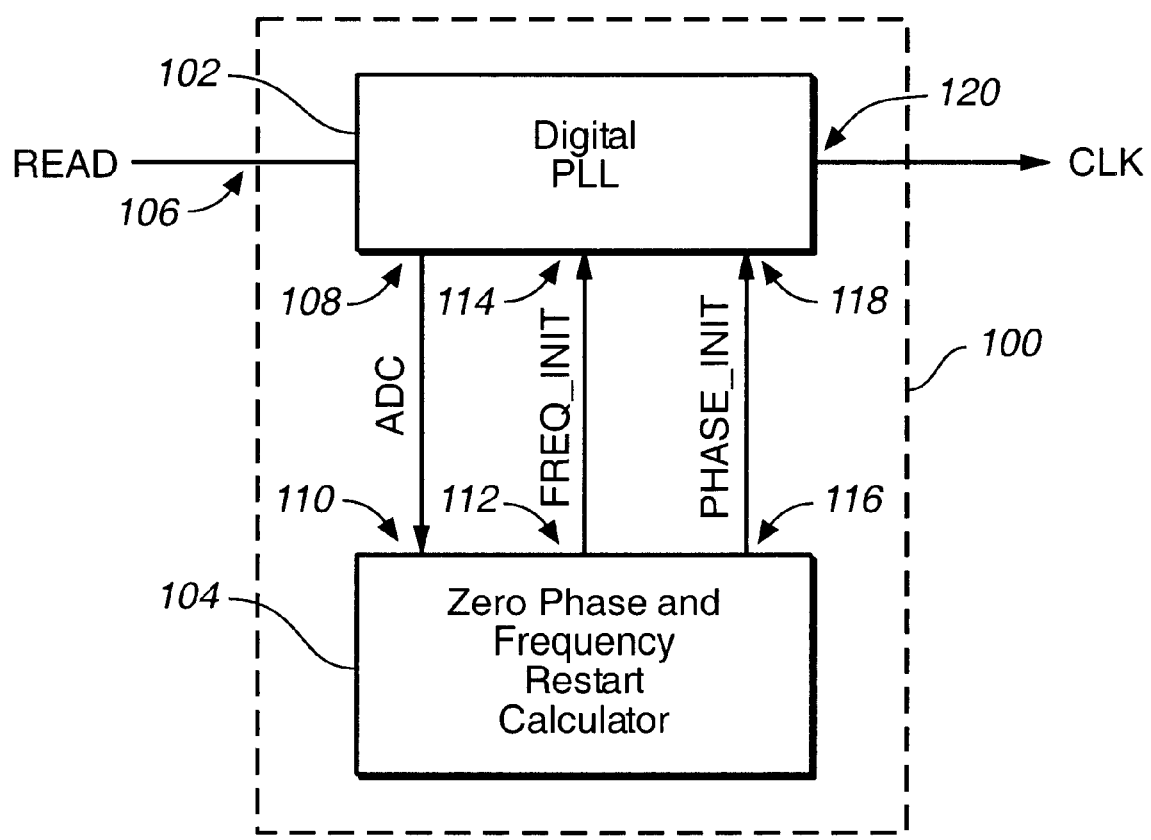
FIG._3

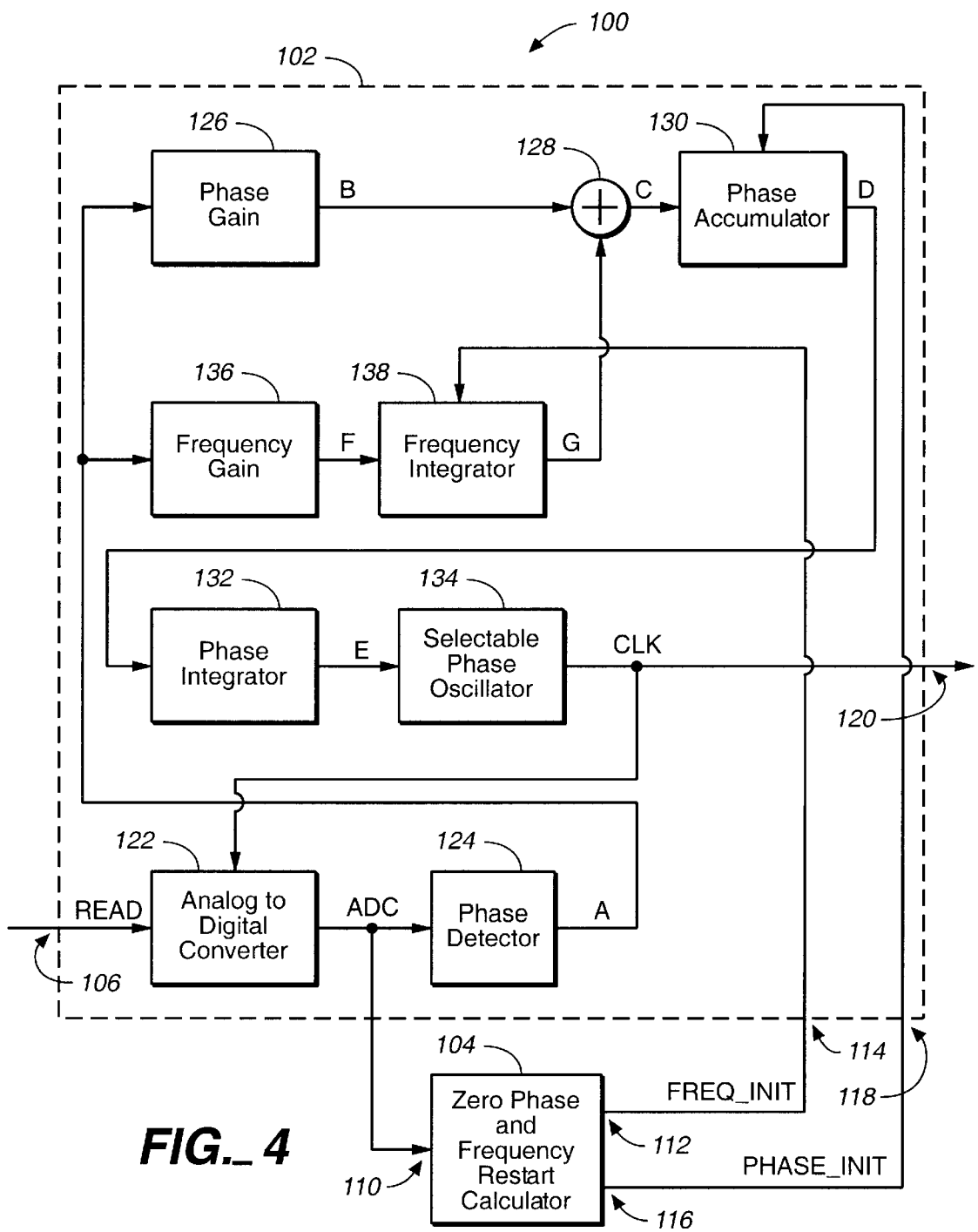
FIG._4

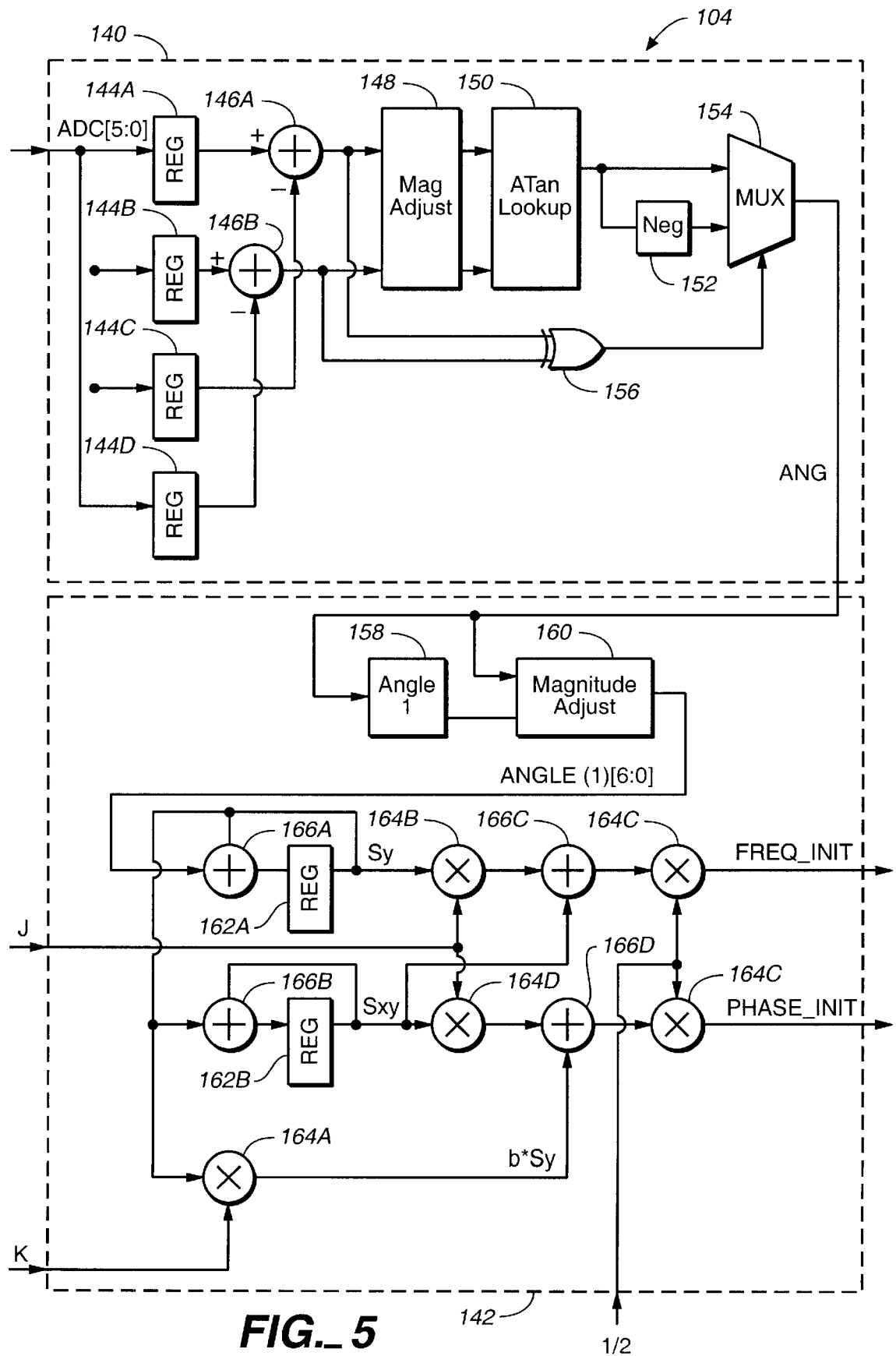
*FIG._5*

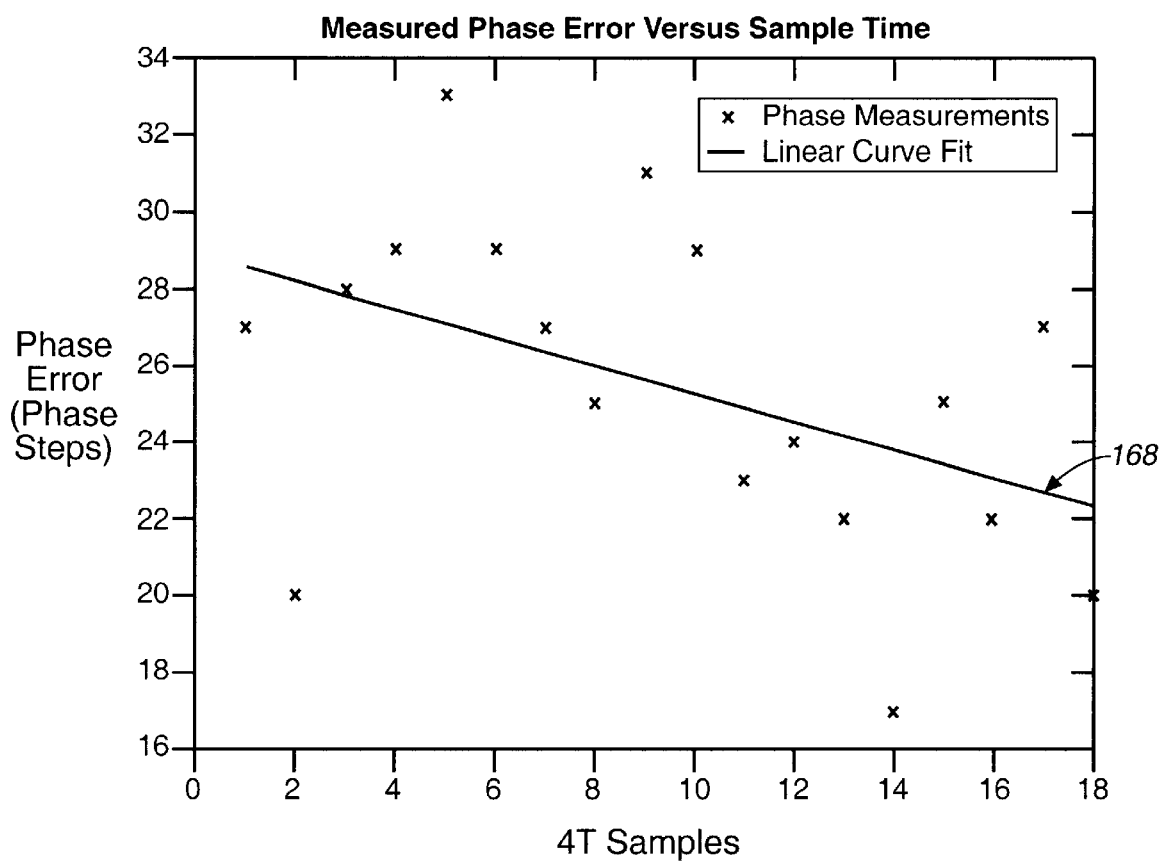
FIG._6

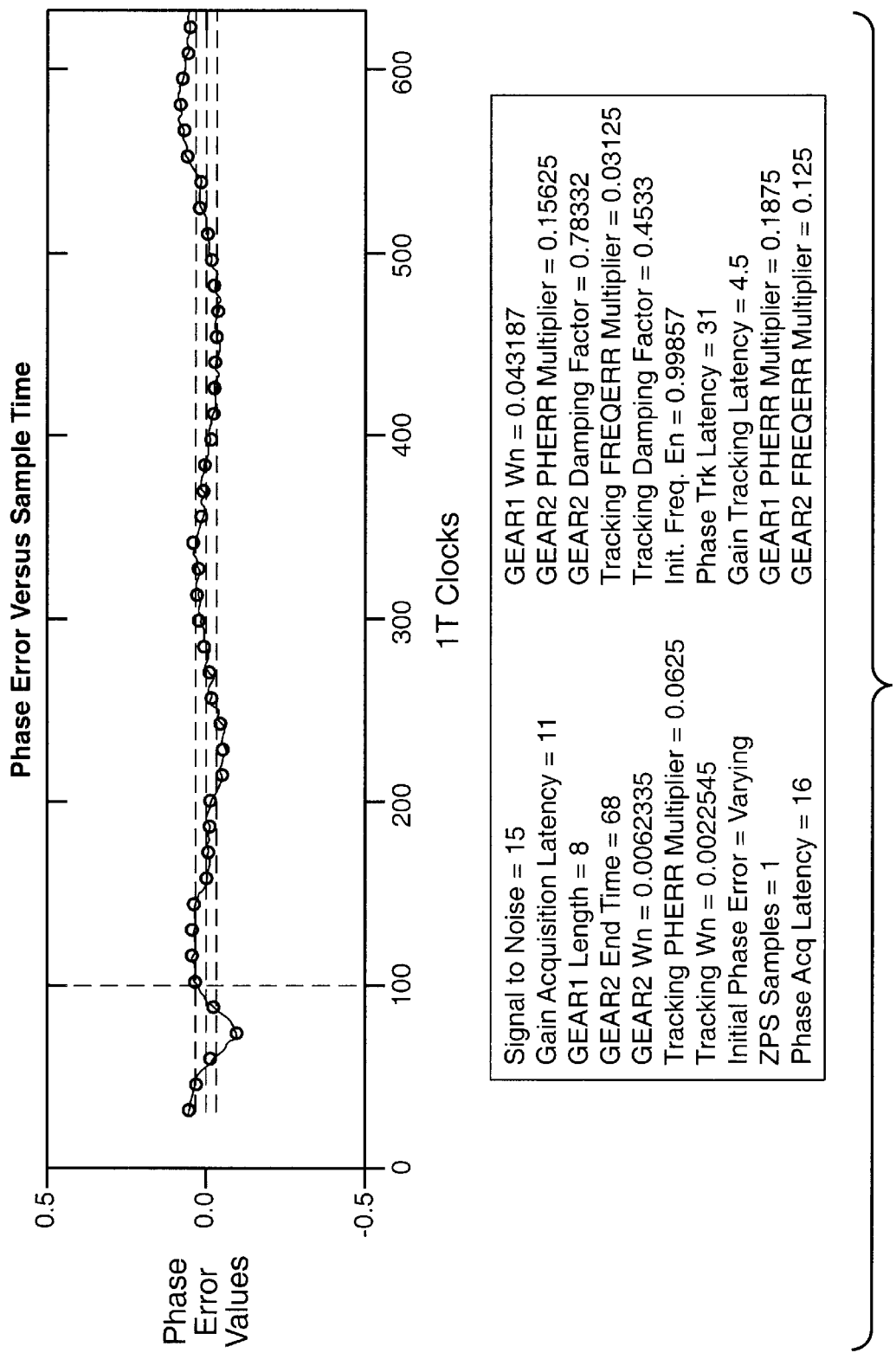
FIG._7A
(Conventional)

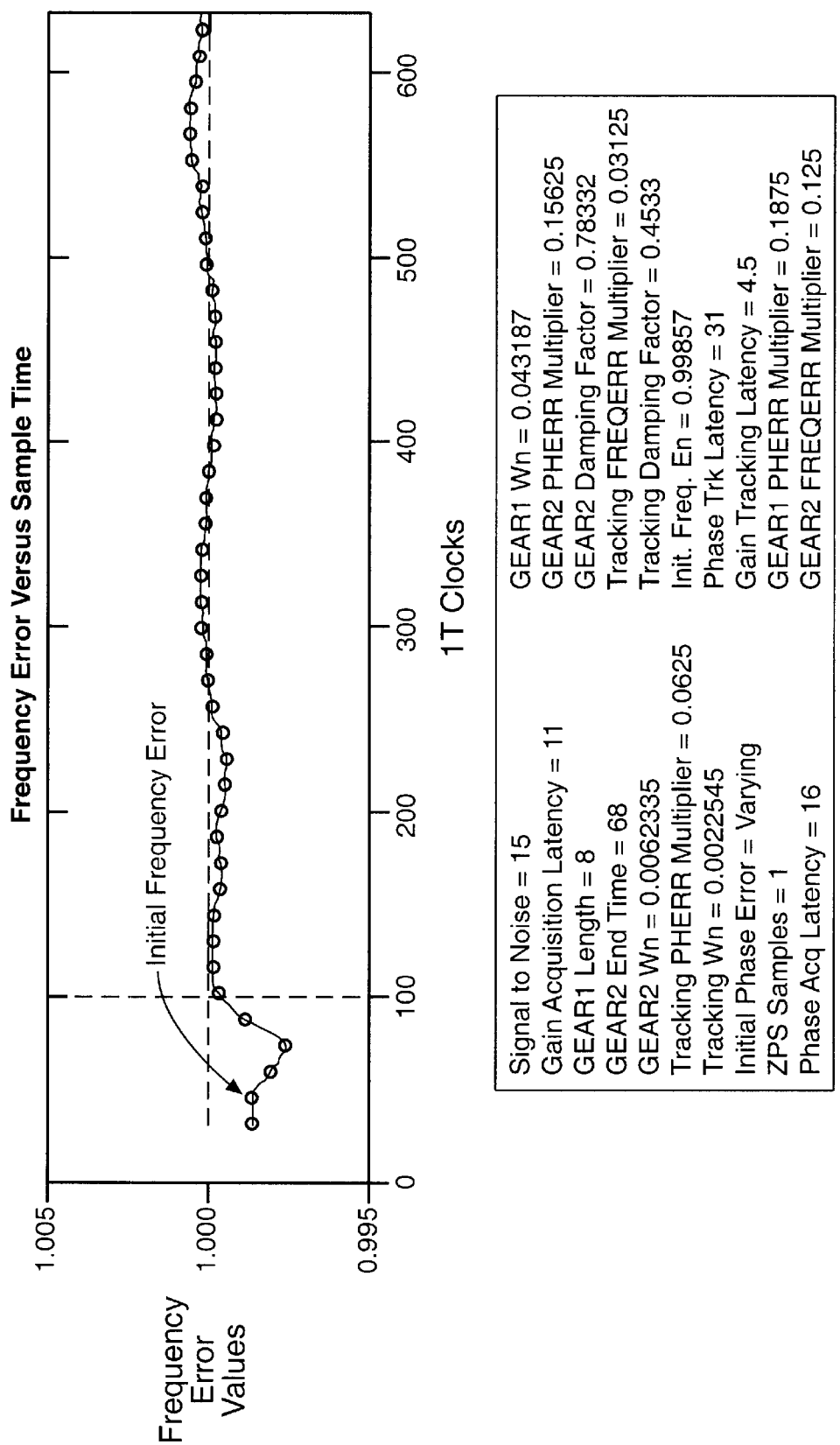
FIG._7B
(Conventional)

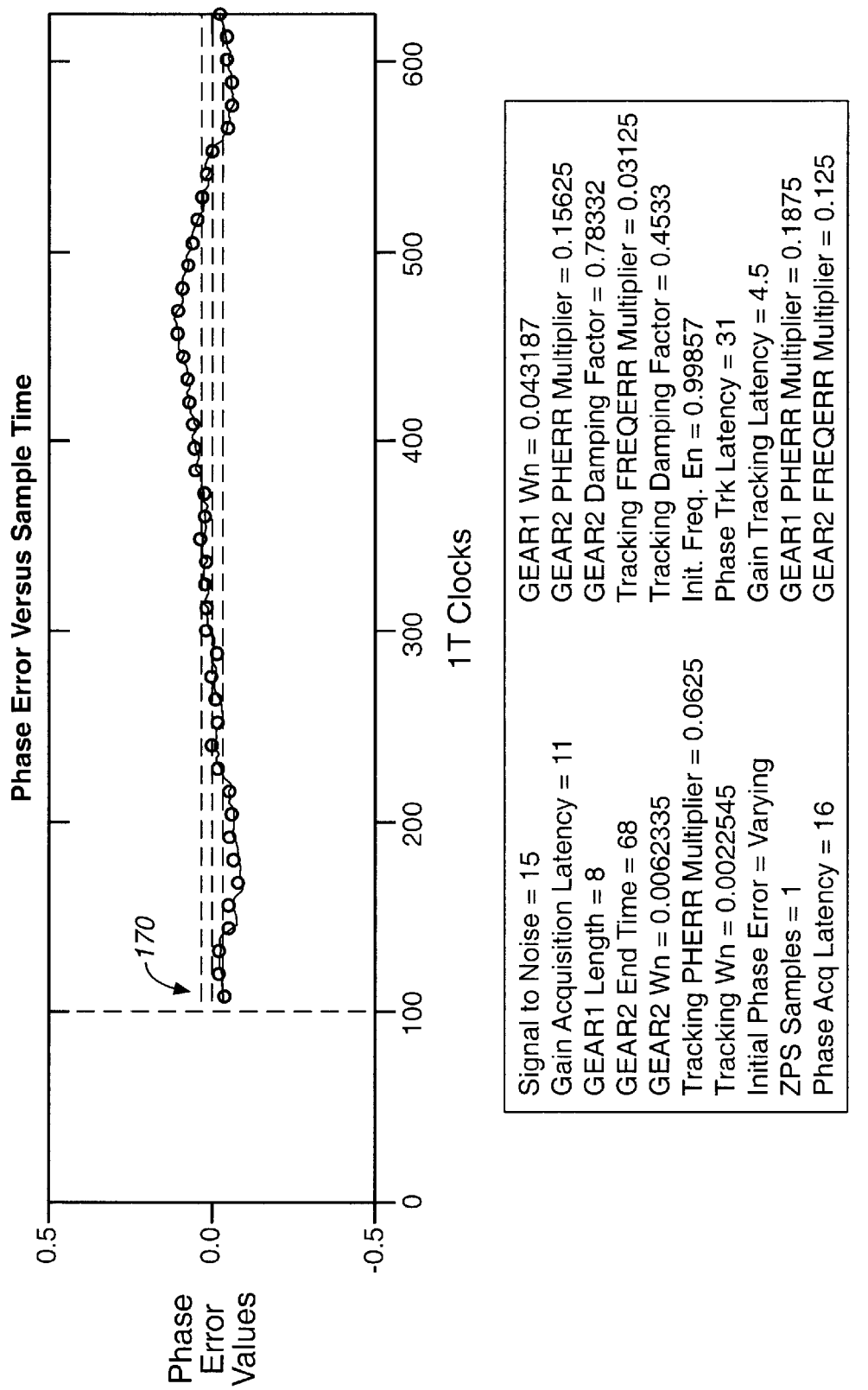
FIG._8A

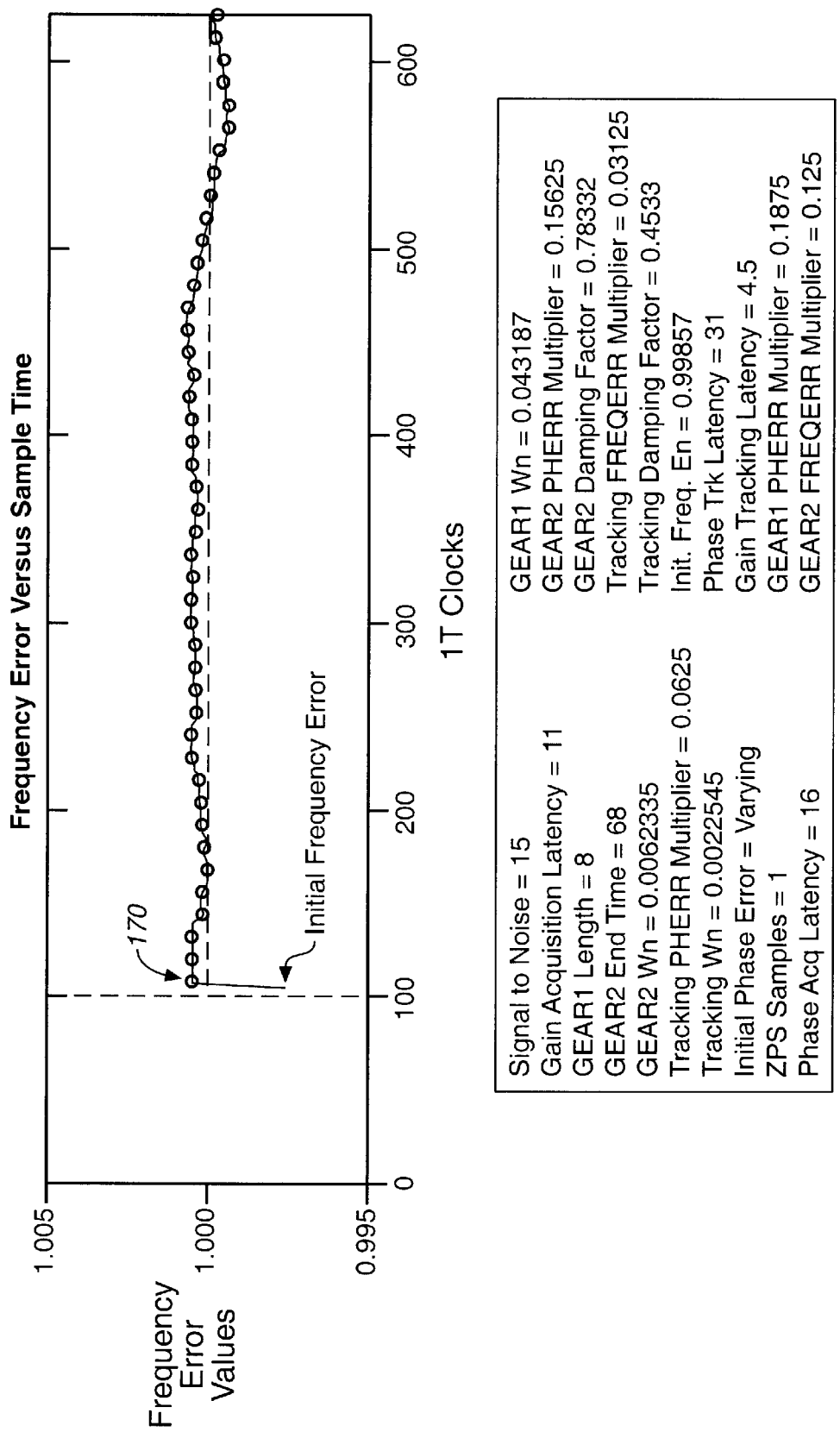
FIG._8B

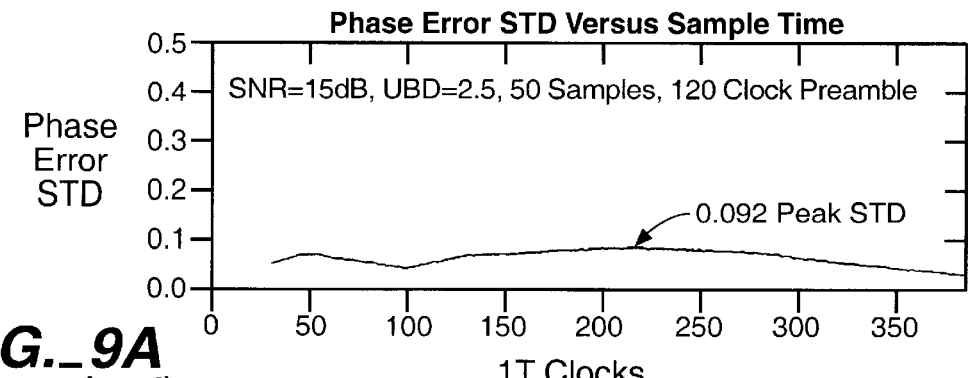
FIG._9A (Conventional)
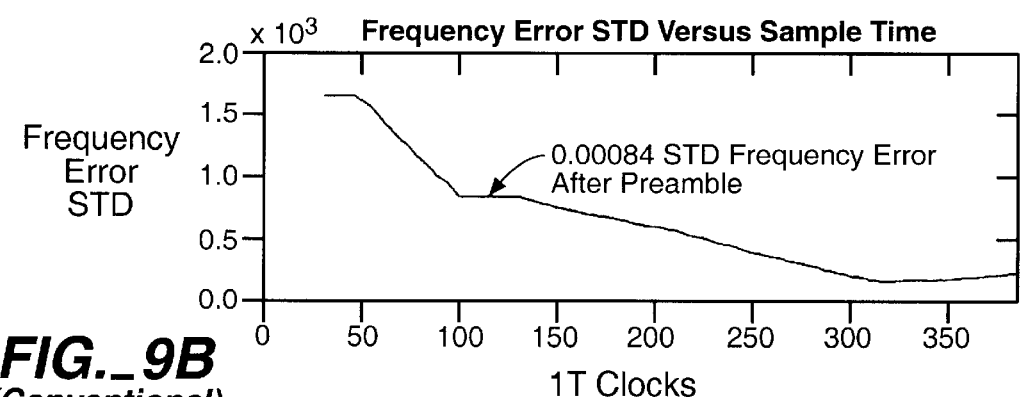
FIG._9B (Conventional)
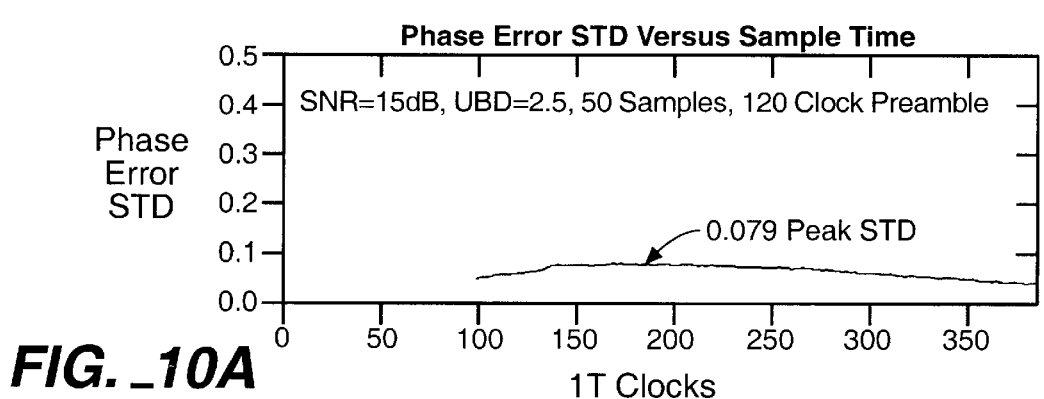
FIG._10A
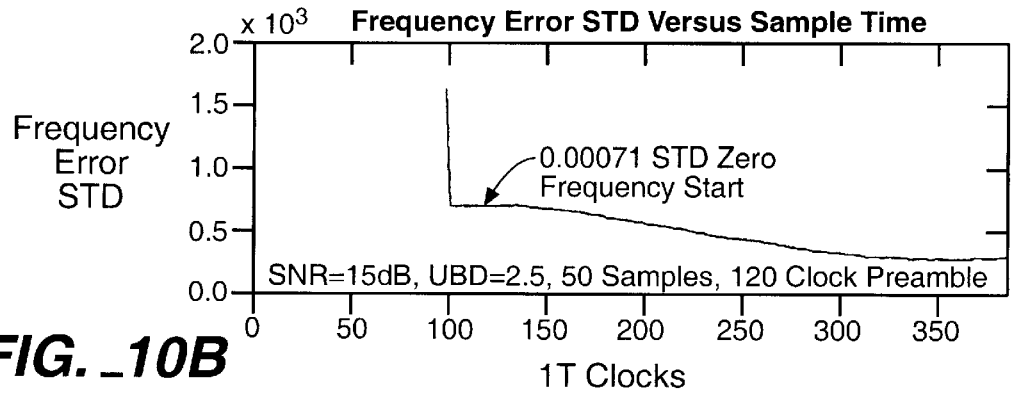
FIG._10B

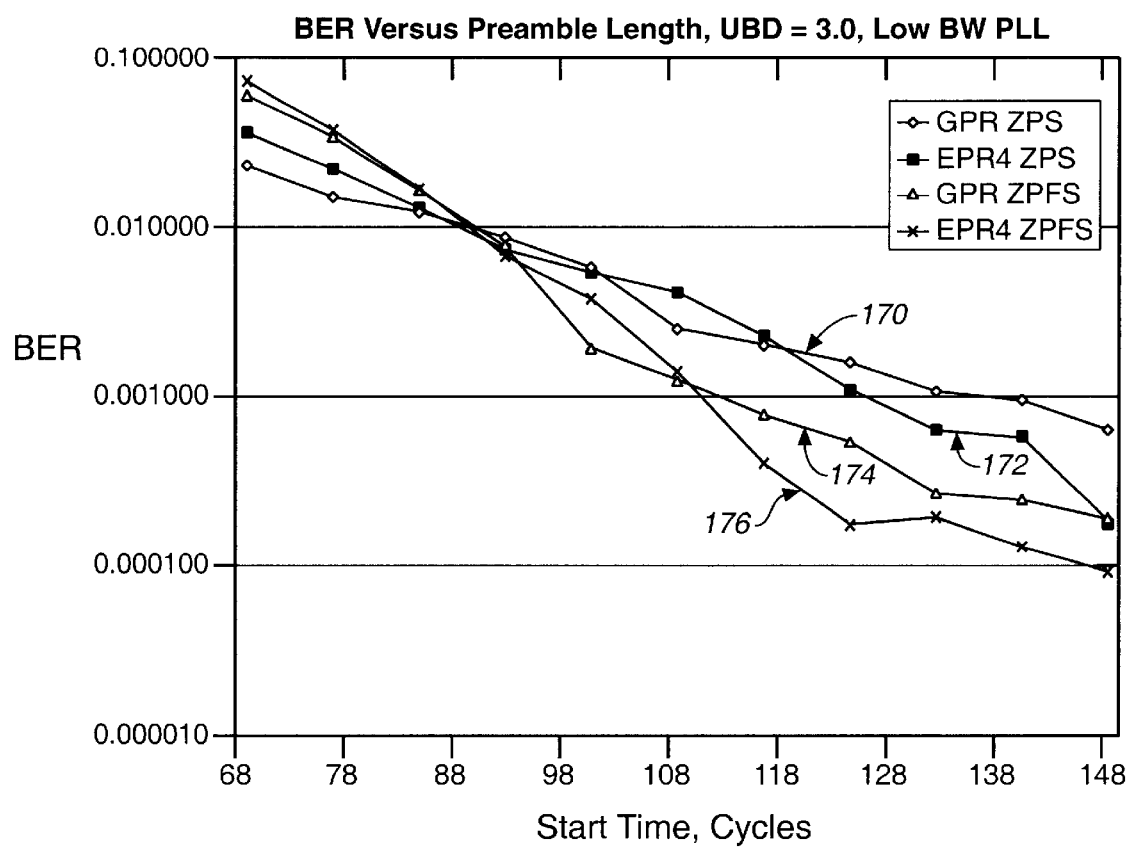
FIG. _11

ZERO PHASE AND FREQUENCY RESTART PLL

FIELD OF THE INVENTION

The present invention relates to a method and/or architecture for implementing a phase lock loop generally and, more particularly, to a method and/or architecture for implementing a zero phase and frequency restart phase lock loop.

BACKGROUND OF THE INVENTION

An acquisition of an input signal by a conventional phase lock loop (PLL) commonly involves three phases or modes. First, a single cycle zero phase start (ZPS) is performed to initialize a PLL clock signal phase at approximately an input signal phase. A short PLL phase-only mode is then performed to minimize any error in the PLL clock signal phase relative to the input signal phase. Finally, a phase and frequency acquisition mode is entered where the PLL clock tracks the input signal in both phase and frequency. The conventional acquisition approaches are limited in that convergence to the correct phase and frequency takes a considerable amount of time.

A common method of improving the acquisition speed of a PLL is to change a loop bandwidth of the PLL, known as gear shifting, when changing modes. A high loop bandwidth (i.e., Gear 1 mode) is used during the phase-only mode to adjust the PLL clock signal phase rapidly. A low loop bandwidth (i.e., Gear 2 mode) is used during the phase and frequency acquisition mode and while tracking data to reduce an output jitter.

Referring to FIG. 1, a waveform of a signal 20 from a conventional disk drive sector with no noise is shown. The signal 20 consists of three parts, a preamble 22, a sync mark 24, and data 26. FIG. 2 is a waveform of a signal 28 similar to signal 20 with typical noise added. The signal 28 includes the preamble 22, the sync mark 24, and the data 26. The preamble 22 is commonly made up of a repeating 2T—2T signal. Because of the high density at which the signal 28 is recorded, the preamble 22 is virtually a sine wave.

In a conventional hard disk drive application, the preamble 22 and sync mark 24 appear at the start of each sector of data 26. As a result, a PLL reading the signal 28 must reacquire phase lock at the start of each sector. The ZPS PLL determines the phase from a single cycle of the preamble 22. The Gear 1 and The Gear 2 modes are continuously using the most recent phase data and discarding older data (low pass filtering). If the phase lock acquisition time of a PLL can be shortened, then the preamble 22 in each sector can be made smaller. Smaller preambles 22 leave more room in the disk for the data 26.

SUMMARY OF THE INVENTION

The present invention concerns a circuit generally comprising a first circuit and a phase lock loop. The first circuit may be configured to (i) collect a plurality of samples per cycle during a plurality of cycles of an input signal and (ii) calculate a phase offset and a frequency offset for the input signal relative to a clock signal in response to the samples. The phase lock loop may be configured to (i) preset a phase error signal to the phase offset and a frequency error signal to the frequency offset and (ii) generate the clock signal in response to the phase error signal and the frequency error signal.

The objects, features and advantages of the present invention include providing a phase lock loop that may (i) lock to an input signal in a short time, (ii) lock to an input signal with a small frequency and phase starting error, and/or (iii) quickly lock to an input signal having a known frequency preamble.

BRIEF DESCRIPTION OF THE DRAWINGS

These and other objects, features and advantages of the present invention will be apparent from the following detailed description and the appended claims and drawings in which:

FIG. 1 is a conventional waveform of a start of sector signal from a hard disk drive with no noise;

FIG. 2 is a conventional waveform of a start of sector signal from a hard disk drive with noise;

FIG. 3 a block diagram of a circuit implementing the present invention;

FIG. 4 is a block diagram of a digital phase lock loop circuit;

FIG. 5 is a block diagram of a zero phase and frequency restart calculator circuit;

FIG. 6 is a graph illustrating a linear curve fit;

FIGS. 7A & 7B are the graphs illustrating a typical phase error and frequency error as a function of time for a conventional zero phase start phase lock loop;

FIGS. 8A & 8B are the graphs illustrating a typical phase error and frequency error as a function of time for the present invention;

FIGS. 9A & 9B are the graphs illustrating a typical peak standard deviation of the phase error and a typical standard deviation of the frequency error as a function of time for the conventional zero phase start phase lock loop;

FIGS. 10A & 10B are the graph illustrating a typical peak standard deviation of the phase error and a typical standard deviation of the frequency error as a function of time for the present invention; and FIG. 11 is a graph illustrating bit error rates for the conventional zero phase start phase lock loop and the present invention.

DETAILED DESCRIPTION OF THE PREFERRED EMBODIMENTS

Referring to FIG. 3, a block diagram of a circuit 100 is shown in accordance with a preferred embodiment of the present invention. The circuit 100 may be implemented as a zero phase and frequency restart (ZPFS) PLL. The circuit 100 may be applied where fast frequency and phase acquisition is required and/or where a predetermined constant frequency preamble is available.

The circuit 100 generally comprises a circuit 102 and a circuit 104. The circuit 102 may have an input 106 to receive a signal (e.g., READ). The circuit 102 may have an output 108 to present a signal (e.g., ADC) to an input 110 of the circuit 104. The circuit 104 may have an output 112 to present a signal (e.g., FREQ_INIT) to an input 114 of the circuit 102. The circuit 104 may have an output 116 that may present a signal (e.g., PHASE_INIT) to an input 118 of the circuit 102. The circuit 102 may have an output 120 to present a signal (e.g., CLK).

The circuit 100 may over sample each cycle of the signal READ. The samples may be used to determine the phase of the signal READ relative to the signal CLK using an arctangent lookup table. A curve fit operation may be performed on the resulting phase error data. For a linear least squared error curve fit operation, the resulting y-intercept value may equal an initial phase error of phase offset between the signal READ and the signal CLK. The resulting slope value may equal a frequency error or frequency offset between the signal READ and the signal CLK. The circuit 100 may then preset internal error signals to the frequency offset and initial phase offset to adjust the frequency and phase of the signal CLK to match quickly and/or closely that of the signal READ.

The signal READ may be implemented as an analog input signal. The signal READ may be obtained from a read channel (not shown) of a hard disk drive, a magnetic tape drive, an optical drive, a magneto-optical drive, a communications receiver, and the like. The signal READ may have the preamble 22, the sync mark 24, and/or the data 26 as shown in FIG. 2. The preamble 22 may have a duration of one hundred or more cycles. The preamble 22 may have a predetermined frequency.

The signal ADC may be implemented as a digital signal. The signal ADC may be a digitized version of the signal READ having a sample rate determined by the signal CLK. A resolution of the signal ADC may be six bits or greater. Other resolutions of the signal ADC may be implemented to meet the design criteria of a particular application.

The signal FREQ_INIT may be implemented as a digital signal. The signal FREQ_INIT may represent a frequency offset between the preamble 22 and the signal CLK. The signal FREQ_INIT may be active at least once during or immediately following each preamble 22 within the signal READ.

The signal PHASE_INIT may be implemented as a digital signal. The signal PHASE_INIT may represent a phase offset between the preamble 22 and the signal CLK. The signal PHASE_INIT may be active at least once during or immediately following each preamble 22 within the signal READ.

The signal CLK may be implemented as a clock signal. The signal CLK may have a variable phase. The signal CLK may have a variable frequency. The frequency of the signal CLK may be approximately an integer multiple of a frequency of the preamble 22. For example, the signal CLK frequency may be four times faster than the preamble 22 frequency. In general, n cycles of the signal CLK may be referred to as "nT". For example, a single cycle of the signal CLK may be referred to as "1T".

The circuit 102 may be implemented as a digital phase lock loop (PLL) circuit. The PLL circuit 102 may generate the signal CLK. The signal CLK may be generated at a predetermined frequency during the preamble 22 and/or in the absence of the signal READ. The PLL circuit 102 may vary the phase and/or the frequency of the signal CLK while tracking the signal READ. The PLL circuit 102 may adjust a phase of the signal CLK in response to the signal PHASE_INIT. The PLL circuit 102 may adjust a frequency of the signal CLK in response to the signal FREQ_INIT.

The PLL circuit 102 may also digitize the signal READ to present the signal ADC. The signal ADC may be sampled and digitized once per cycle of the signal CLK. Since the signal CLK frequency is generally an integer multiple of the preamble 22 frequency, the signal ADC may represent multiple samples of the signal READ for each cycle of the signal READ.

The circuit 104 may be implemented as a zero phase and frequency restart (ZPFS) calculator circuit. The ZPFS calculator circuit 104 may calculate the signal FREQ_INIT and the signal PHASE_INIT based upon the signal ADC. In particular, the ZPFS calculator circuit 104 may collect the multiple samples per cycle within the signal ADC during multiple cycles of the signal READ. The sample collection may occur over some or all of the preamble 22, or other suitable period in the signal READ. After a predetermined number of samples have been collected, the ZPFS calculator circuit 104 may calculate the signal FREQ_INIT and the signal PHASE_INIT using some or all of the samples. In general, the ZPFS calculator circuit 104 equally weights all of the collected samples when calculating the signal FREQ_INIT and the signal PHASE_INIT.

Referring to FIG. 4, a block diagram of the PLL circuit 102 is shown. The PLL circuit 102 generally comprises multiple circuits 122–138. The circuit 122 may receive the signal READ, receive the signal CLK, and present the signal ADC. The circuit 124 may receive the signal ADC and present a signal (e.g., A). The circuit 126 may receive the signal A and present a signal (e.g., B). The circuit 128 may receive the signal B, receive a signal (e.g., G) and present a signal (e.g., C). The circuit 130 may receive the signal C, receive the signal PHASE_INIT, and present a signal (e.g., D). The circuit 132 may receive the signal D and present a signal (e.g., E). The circuit 134 may receive the signal E and present the signal CLK. The circuit 136 may receive the signal A and present a signal (e.g., F). The circuit 138 may receive the signal F, receive the signal FREQ_INIT, and present the signal G.

The circuit 122 may be implemented as an analog to digital converter circuit. The analog to digital converter circuit 122 may convert the signal READ to the signal ADC based upon the signal CLK. The circuit 124 may be implemented as a phase detector circuit. The signal A may be implemented as a phase error signal presented by the phase detector circuit 124 in response to the signal ADC. The circuit 126 may be implemented as a phase gain circuit. The signal B may be implemented as an amplified phase error signal presented by the phase gain circuit 126 in response to the signal A. The circuit 128 may be implemented as an adder circuit. The signal C may be presented by the adder circuit 128 as a sum of the signal B and the signal G.

The circuit 130 may be implemented as a phase accumulator circuit. The signal D may be implemented as a phase error signal presented by the phase accumulator circuit 130. The phase accumulator circuit 130 may present the signal D equal to the signal PHASE_INIT when the signal PHASE_INIT is asserted. The circuit 132 may be implemented as a phase integrator. The signal E may be implemented as an integrated signal presented by the phase integrator circuit 132. The circuit 134 may be implemented as a selectable phase oscillator circuit. The selectable phase oscillator circuit 134 may generate the signal CLK in response to the signal E.

The circuit 136 may be implemented as a frequency gain circuit. The signal F may be implemented as an amplified error signal presented by the frequency gain circuit 136 in response to the signal A. The circuit 138 may be implemented as a frequency integrator circuit. The signal G may be implemented as a frequency error signal presented by the frequency integrator circuit 138 in response to the signal F. The frequency integrator circuit 138 may present the signal G equal to the signal FREQ_INIT when the signal FREQ_INIT is asserted.

During the preamble 22, the selectable phase oscillator 134 may present the signal CLK at a predetermined frequency. The signal CLK may then asynchronously trigger the analog to digital converter circuit 122 to convert samples of the signal READ to the signal ADC. The ZPFS calculator circuit 104 may then collect the predetermined number of samples. After collecting and processing the samples, the ZPFS calculator circuit 104 may assert the signal FREQ_INIT and the signal PHASE_INIT. The frequency integrator circuit 138 may respond to the signal FREQ_INIT by presetting the signal G equal to the signal FREQ_INIT. The phase accumulator circuit 130 may respond to the signal PHASE_INIT by setting the signal D equal to the signal PHASE_INIT. The preset values of the signal G and the signal D may cause the selectable phase oscillator circuit 134 to preset the signal CLK to approximately the same frequency and the same phase as the preamble 22.

Referring to FIG. 5, a block diagram of an example embodiment of the ZPFS calculator circuit 104 is shown. The ZPFS calculator circuit 104 generally comprises a circuit 140 and a circuit 142. The circuit 140 may receive the signal ADC and present a signal (e.g., ANG). The circuit 142 may receive the signal ANG and present the signals FREQ_INIT and PHASE_INIT. The circuit 142 may also receive one or more signal (e.g., J, K and L). In one embodiment, the signals J, K and L may be generated internally to the circuit 142.

The circuit 140 may be implemented as an angle determining circuit. The circuit 140 generally comprises multiple registers 144A–D, multiple adders 146A–B, a magnitude adjuster 148, an arctangent lookup table 150, a circuit 152 that converts a digital value into a negative digital value, a multiplexer 154, and a logic gate 156 (e.g., XOR gate). The circuit 140 generally has a register 144A–D for each sample of the preamble 22 converted by the analog to digital converter 122 during a cycle of the preamble 22. In one embodiment, there are four registers 144A–D to simultaneously store four samples per cycle of the preamble 22. Other numbers of samples per cycle may be implemented to meet the design criteria of a particular application.

During the preamble 22, the four samples per cycle of the preamble 22 may be obtained at equal time intervals since the signal CLK may be operating at the predetermined frequency. By taking four samples with equal spacing, the samples may be considered quadrature samples (e.g., sin, cosine, −sin, −cosine). For each quadrature sample (e.g., Y) of the preamble 22 at a time (e.g., X), the phase or angle (e.g., the signal ANG) of the preamble 22 with respect to the signal CLK may be determined by equation 1 as given below:

$$ANG(X, Y) := \arctan\left(\frac{Y(X+0) - Y(X+2)}{Y(X+1) - Y(X+3)}\right) \quad \text{Eq. 1}$$

The equation 1 may be implemented by the adders 146A–B, the magnitude adjuster 148, the arctangent lookup table 150, the circuit 152, the multiplexer 154, and the logic gate 156.

In one embodiment, the six-bit signal ADC may be stored in the registers 144A–D. The adder circuits 146A–B may produce seven-bit signals to maintain accuracy when preforming the add function. The magnitude adjustment circuit 148 may adjust the signal presented by the adder circuit 146A–B by presenting the five most significant bits to the arctangent lookup table 150. The signal ANG presented by the arctangent lookup table 150 may be implemented as a six-bit signal for accuracy purposes. Other bit widths of the signal ADC and the signal ANG may be implemented to meet the design criteria of a particular application.

The circuit 142 may be implemented as a curve fitting circuit. The circuit 142 generally comprises a register 158, a magnitude adjust circuit 160, multiple registers 162A–B, several multiplication circuits 164A–E, and several adder circuit 166A–D. The register 158 may store a first or initial phase error of the preamble 22 as conveyed by the signal ANG. The magnitude adjustment circuit 160 may adjust a magnitude of the signal ANG to present a signal (e.g., ANGLE) prior to reception by the adder circuits 166A–B. The registers 162A–B, the multiplication circuit 164A–E and the adder circuit 166A–D may implement a linear least squared error fit. The signals J, K and L may be constants that depend upon the number of samples being processed. For example, the signal J may have a constant value of 0, 0.5, 1, 1.5, . . . or 31 for a 1, 2, 3, 4 . . . or 32-sample calculation respectively. The signal K may have a constant value of 0, 0.5, 1.66, 3.5, . . . or 325.5 for the 1, 2, 3, 4, . . . or 32-sample calculation. The signal L inverted (e.g., 1/L) may have a constant value of infinity (e.g., very large), 2, 0.5, 0.2, . . . or 0.0003665 for the 1, 2, 3, 4, . . . or 32-sample calculation.

In one embodiment, the signal READ may have a known predetermined frequency during the preamble 22. Examples of implementations where the signal READ has a preamble 22 with a known frequency include, but are not limited to, a hard disk drive, optical drive and tape drive implementation. As a result, the circuit fitting circuit 142 may be configured to calculate the signal PHASE_INIT by averaging the samples received via the signal ANG. The signal FREQ_INIT may need not be determined since the frequency of the preamble 22 is already known. Other curve fitting processes may be implemented within the curve fitting circuit 142 to meet the design criteria of a particular application.

Referring to FIG. 6, a graph of a linear curve fit for an example set of phase errors (e.g., phase steps) versus time (e.g., 4T samples) is shown. The linear least squared error fit minimizes a squared error between the data points and a line 168 defined by equation 2 below:

$$Y(X) = MX + Y0 \quad \text{Eq. 2}$$

Where a y-intercept variable (e.g., Y0) may be the initial phase error (e.g., PHASE_INIT=Y0) and a slope variable (e.g., M) may be the frequency error (e.g., FREQ_INIT= M). Equations 3 through equation 9 may be used to calculate the linear least squared error fit as shown below:

$$Y_0 := \frac{S_Y \times S_{XX} - S_X \times S_{XY}}{S \times S_{XX} - S_X^2} \quad \text{Eq. 3}$$

$$M := \frac{S \times S_{XY} - S_X \times S_Y}{S \times S_{XX} - S_X^2} \quad \text{Eq. 4}$$

$$S := \sum_{i=0}^{P\_LENGTH/N} ANGLE(N \times i) \quad \text{Eq. 5}$$

$$S_X := \sum_{i=0}^{P\_LENGTH/N} Xi \quad \text{Eq. 6}$$

$$S_{XX} := \sum_{i=0}^{P\_LENGTH/N} (Xi)^2 \quad \text{Eq. 7}$$

$$S_Y := \sum_{i=0}^{P\_LENGTH/N} ANGLE(N \times i) \quad \text{Eq. 8}$$

-continued $$S_{XY} := \sum_{i=0}^{P\_LENGTH/N} Xi \times ANGLE(N \times i) \quad \text{Eq. 9}$$

where $Xi := \begin{bmatrix} P\_LENGTH/N \\ \vdots \\ 1 \\ 0 \end{bmatrix}$

The variable N may be the number of samples per cycle of the preamble 22. The variable P_LENGTH may be the total number of samples collected and processed.

In an example application where P_LENGTH=40 and N=4, then SxSxx−Sx²=1,210, S=11, Sxx=385 and Sx=55 for each preamble 22. Other values of the variable P_LENGTH may be used to meet the design criteria of a particular application. Given 4 samples per cycle (e.g., N=4), the variable P_LENGTH may be as low as 8 so that at least 2 phase error data points are available for the curve fitting process. Larger values of the variable P_LENGTH, such as 16, 32, 64, 100, 200, 400 and greater may also be implemented. An upper limit of the variable P_LENGTH may be determined by a duration of the preamble 22 and the number of samples per cycle.

Referring to FIG. 7A, a graph illustrating typical phase error values versus time for a conventional zero phase start (ZPS) PLL receiving an example signal READ is shown. Referring to FIG. 7B, a graph illustrating typical frequency error values versus time for the conventional ZPS PLL receiving the example signal READ is shown. The example signal READ may have a preamble 22 of 100 1T clocks, a sync mark 24, and random data 26.

Referring to FIG. 8A, a graph illustrating typical phase error values versus time for the circuit 100 receiving the example signal READ is shown. Referring to FIG. 8B, a graph illustrating typical frequency error values versus time for the circuit 100 receiving the example signal READ is shown. The phase error values and the frequency error values may be absent during the first 100 1T clocks because the ZPFS calculator circuit 104 may de-assert the signal FREQ_INIT and the signal PHASE_INIT while processing the data points. At a time 170, shortly after the 100th 1T clock, the ZPFS calculator circuit 104 may assert the signal FREQ_INIT and the signal PHASE_INIT causing the PLL circuit 102 to adjust and restart the signal CLK prior to tracking the data 26.

Referring to FIG. 9A, a graph illustrating a typical peak standard deviation of the phase error as a function of time for the conventional ZPS PLL receiving the example signal READ is shown. Referring to FIG. 9B, a graph illustrating a typical standard deviation of the frequency error as a function of time for the conventional ZPS PLL receiving the example signal READ is shown. Referring to FIG. 10A, a graph illustrating a typical peak standard deviation of the phase error as a function of time for the circuit 100 receiving the example signal READ is shown. Referring to FIG. 10B, a graph illustrating a typical standard deviation of the frequency error as a function of time for the circuit 100 receiving the example signal READ is shown.

The peak standard deviation of the phase error during the random data 26 is generally reduced from 0.092 for the conventional ZPS PLL to 0.079 for the circuit 100. The standard deviation of the frequency error after the preamble 22 is generally reduced from 0.00084 for the conventional ZPS PLL to 0.00071 for the circuit 100. Therefore, the circuit 100 may achieve a smaller phase error than a conventional ZPS PLL when beginning to track the random data 26. The circuit 100 may also achieve a smaller peak standard deviation of the frequency error than a conventional ZPS PLL while tracking random data 26.

Referring to FIG. 11, a graph illustrating bit error rates (BER) for a first 500 bits of a sector as a function of a preamble length is shown. A curve 170 may represent a bit error rate for a conventional ZPS PLL receiving a signal READ arranged for a generalized partial response (GPR). A curve 172 may represent a bit error rate for the conventional ZPS PLL receiving a signal READ arranged for an extended partial response 4 (EPR4). A curve 174 may represent a bit error rate for the circuit 100 receiving the signal READ arranged for the GPR. A curve 176 may represent a bit error rate for the circuit 100 receiving the signal READ arranged for the EPR4. The curves 170, 172, 174 and 176 generally suggest that the circuit 100 may provide a lower bit error rate than a conventional ZPS PLL for preamble lengths of approximately 94 cycles and longer.

As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
   an input for receiving an input signal;
   a first circuit configured to (i) collect a plurality of samples per cycle during a plurality of cycles of said input signal and (ii) calculate a phase offset and a frequency offset for said input signal relative to a clock signal in response to said samples; and
   a phase lock loop configured to (i) preset a phase error signal to said phase offset and a frequency error signal to said frequency offset and (ii) generate said clock signal at an output in response to said phase error signal and said frequency error signal.

2. The circuit according to claim 1, wherein said phase lock loop is further configured to adjust said phase error signal and said frequency error signal in response to said input signal after presetting said phase error signal and said frequency error signal.

3. The circuit according to claim 1, wherein said first circuit comprises a second circuit configured to present a plurality of phase errors for said input signal relative to said clock signal.

4. The circuit according to claim 3, wherein said second circuit comprises:
   a plurality of registers configured to store a predetermined number of said samples simultaneously; and
   a lookup table configured to present said phase errors in response to said predetermined number of said samples.

5. The circuit according to claim 3, wherein said first circuit further comprises a third circuit configured to generate said phase offset and said frequency offset in response to said phase errors.

6. The circuit according to claim 5, wherein said third circuit is configured to average said phase errors to generate said phase offset.

7. The circuit according to claim 5, wherein said third circuit is configured to perform a curve fit of said phase errors to present said phase offset and said frequency offset.

8. The circuit according to claim 7, wherein said curve fit is a linear least squared error fit.

9. The circuit according to claim 8, wherein said plurality of samples per cycle is at least four samples and said plurality of cycles is at least eight cycles.

10. A method of initializing a phase lock loop comprising the steps of:

(A) generating a clock signal in response to a phase error signal and a frequency error signal;

(B) collecting a plurality of samples per cycle during a plurality of cycles of an input signal;

(C) calculating a phase offset and a frequency offset for said input signal relative to said clock signal in response to said samples; and (D) presetting said phase error signal to said phase offset and said frequency error signal to said frequency offset in response to calculating said phase value and said frequency value.

11. The method according to claim 10, further comprising the step of adjusting said phase error signal and said frequency error signal in response to said input signal after presetting said phase error signal and said frequency error signal.

12. The method according to claim 10, wherein step (C) comprises the sub-step of generating a plurality of phase errors for said input signal relative to said clock signal.

13. The method according to claim 12, wherein generating said plurality of phase errors comprises the sub-steps of:

storing a predetermined number of said samples simultaneously; and performing a table lookup of said phase errors in response to said predetermined number of said samples.

14. The method according to claim 12, wherein step (C) further comprises the sub-step of generating said phase offset and said frequency offset in response to said phase errors.

15. The method according to claim 14, wherein said phase offset is generated by averaging said phase errors.

16. The circuit according to claim 14, wherein said phase offset and said frequency offset are generated by performing a curve fit of said phase errors.

17. The circuit according to claim 16, wherein said curve fit is a linear least squared error fit.

18. A circuit comprising:

means for generating a clock signal at an output in response to a phase error signal and a frequency error signal;

means for collecting a plurality of samples per cycle during a plurality of cycles of an input signal received at an input;

means for calculating a phase offset and a frequency offset for said input signal relative to said clock signal in response to said samples; and means for presetting (i) said phase error signal to said phase offset and (ii) said frequency error signal to said frequency offset in response to calculating said phase offset and said frequency offset.

* * * * *